(12) United States Patent
Wakabayashi et al.

(10) Patent No.: US 10,784,669 B2
(45) Date of Patent: Sep. 22, 2020

(54) METHOD FOR MANUFACTURING BUSBAR ASSEMBLY

(71) Applicant: Suncall Corporation, Kyoto-shi, Kyoto (JP)

(72) Inventors: Shojiro Wakabayashi, Kyoto (JP); Masaya Nakagawa, Kyoto (JP)

(73) Assignee: Suncall Corporation, Kyoto (JP)

( * ) Notice: Subject to any disclaimer, the term of this patent is extended or adjusted under 35 U.S.C. 154(b) by 0 days.

(21) Appl. No.: 16/642,783

(22) PCT Filed: Aug. 24, 2018

(86) PCT No.: PCT/JP2018/031314
§ 371 (c)(1),
(2) Date: Feb. 27, 2020

(87) PCT Pub. No.: WO2019/044687
PCT Pub. Date: Mar. 7, 2019

(65) Prior Publication Data
US 2020/0194988 A1 Jun. 18, 2020

(30) Foreign Application Priority Data
Sep. 4, 2017 (JP) .................................. 2017-169347

(51) Int. Cl.
*H02G 5/00* (2006.01)
*B05D 5/12* (2006.01)
(Continued)

(52) U.S. Cl.
CPC ............... *H02G 5/005* (2013.01); *B05D 5/12* (2013.01); *C25D 13/12* (2013.01); *H01B 7/00* (2013.01);
(Continued)

(58) Field of Classification Search
CPC . H02G 5/005; B05D 5/12; B05D 7/14; C25D 13/12; C25D 13/00; H01B 7/00;
(Continued)

(56) References Cited

U.S. PATENT DOCUMENTS 3,960,622 A * 6/1976 Hofling .................... H01B 7/08
216/19
2015/0279520 A1* 10/2015 Koda ..................... H01B 13/18
427/510
2016/0268579 A1* 9/2016 Ichikawa ............... H01M 2/202

FOREIGN PATENT DOCUMENTS

EP 1 087 300 A2 3/2001
JP 2007-215340 A 8/2007
(Continued)

OTHER PUBLICATIONS

International Search Report issued in corresponding International Application No. PCT/JP2018/031314, dated Sep. 18, 2018.

*Primary Examiner* — Sherman Ng
(74) *Attorney, Agent, or Firm* — Sterne, Kessler, Goldstein & Fox P.L.L.C.

(57) ABSTRACT

A manufacturing method according to the present invention includes: a step of providing a first conductive metal flat plate; a step of forming a slit in a busbar assembly forming region of the flat plate; a step of coating the flat plate with a coating material containing an insulating resin such that at least the slit is filled with the insulating resin layer; a step of curing the coating material to form the insulating resin layer; and a cutting step of cutting off the insulating resin layer in the slit and busbar forming parts of the first conductive metal flat plate from the first conductive metal flat plate, wherein the busbar forming parts face each other with the slit therebetween.

9 Claims, 18 Drawing Sheets

(51) Int. Cl.
*C25D 13/12* (2006.01)
*H01B 7/00* (2006.01)
*H01R 25/16* (2006.01)
*H01R 43/16* (2006.01)
*H05K 1/05* (2006.01)

(52) U.S. Cl.
CPC ............. *H01R 25/16* (2013.01); *H01R 43/16* (2013.01); *H05K 1/056* (2013.01)

(58) Field of Classification Search
CPC ........ H01B 13/00; H01R 25/16; H01R 43/16; H05K 1/056
USPC ....................................................... 174/70 R
See application file for complete search history.

(56) References Cited

FOREIGN PATENT DOCUMENTS

| | | |
|---|---|---|
| JP | 4432913 B2 | 3/2010 |
| JP | 2016-216766 A | 12/2016 |
| WO | WO-2012/053580 A1 | 4/2012 |

\* cited by examiner

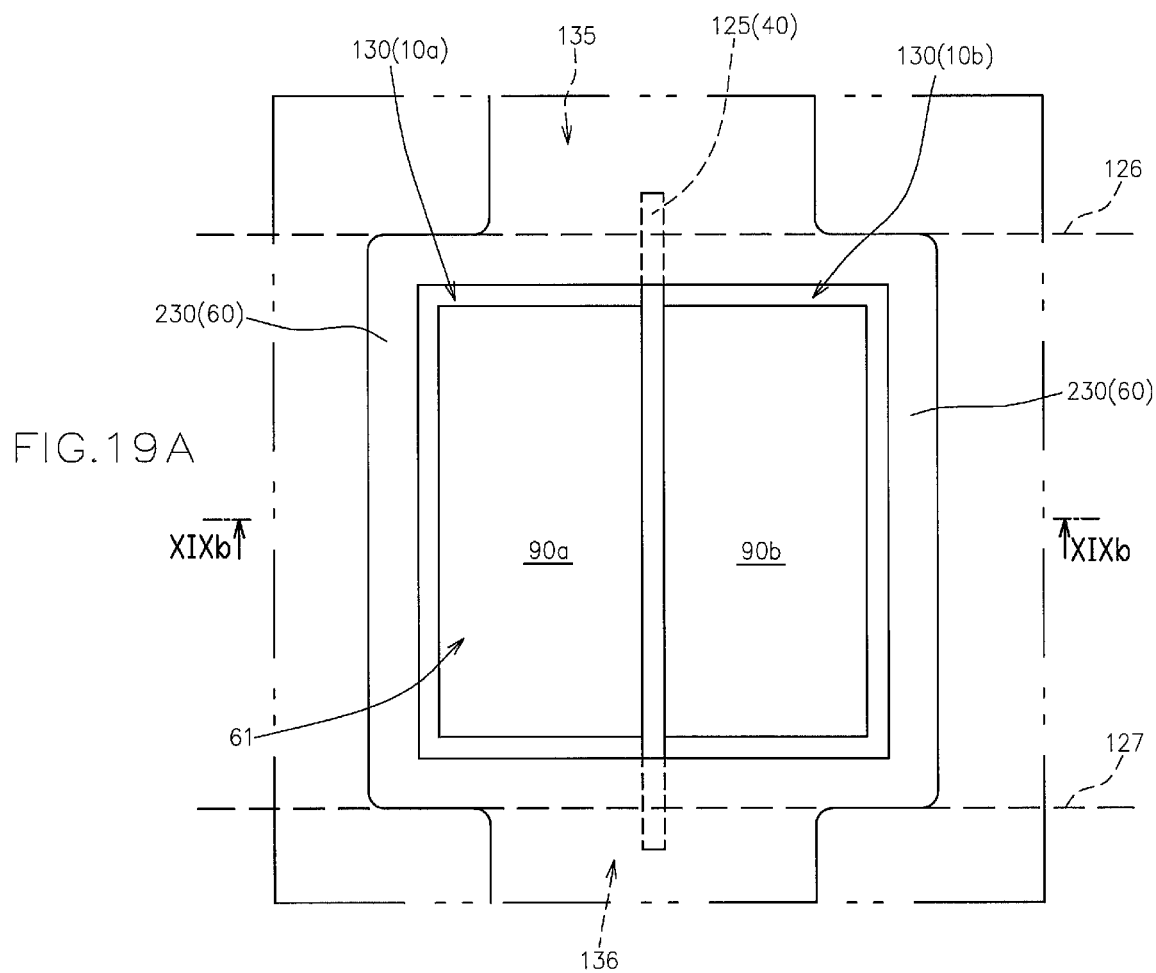
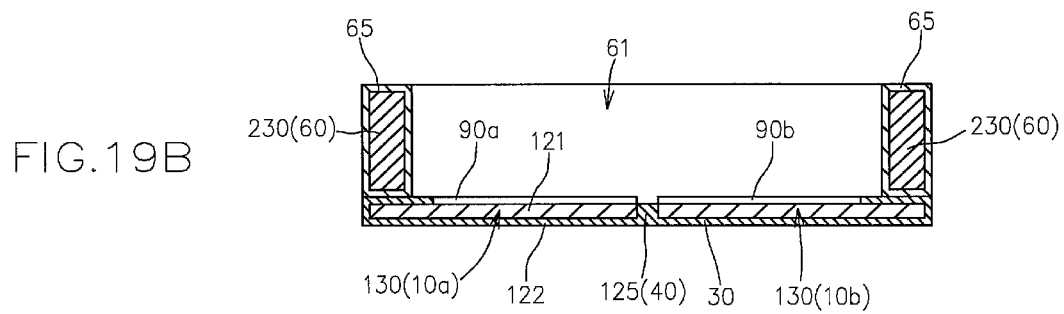

METHOD FOR MANUFACTURING BUSBAR ASSEMBLY

FIELD OF THE INVENTION

The present invention relates to a method for manufacturing a busbar assembly in which a plurality of busbars are electrically insulated and mechanically connected.

BACKGROUND ART

Busbar assemblies in which a plurality of busbars are mutually electrically insulated and mechanically connected are proposed, and are used in various fields (see Patent Literatures 1 and 2 below).

However, since conventional busbar assemblies are of a laminated type in which a first flat plate busbar and a second flat plate busbar in parallel with each other are vertically laminated, and the entirety of the opposing flat surface of the first flat plate busbar and the entirety of the opposing flat surface of the second flat plate busbar are disposed to face each other with an insulating resin therebetween, it is difficult to ensure sufficient reliability with respect to insulation.

Moreover, when manufacturing a busbar assembly of a laminated type as described above, it is necessary to secure a first flat plate busbar and a second flat plate busbar, which are mutually separate components, while vertically separating them from each other by a desired distance, and electrically insulate and mechanically connect the secured busbars by an insulating resin. Thus, there is a problem in that it is difficult to enhance manufacturing efficiency.

That is to say, Patent Literature 1 discloses a method for manufacturing a busbar assembly, comprising a step of providing vertically separable upper and lower molds; a step of disposing first and second flat plate busbars one above the other and securing the busbars in a cavity formed by the upper mold and the lower mold; and injecting an insulating resin into the cavity through resin injecting holes formed in the upper mold and the lower mold.

However, in the manufacturing method described in Patent Literature 1, when disposing the first and second flat plate busbars in the cavity, it is necessary to provide a gap, which is to be filled with a resin, between the outer circumferential surfaces of the first and second flat busbars and the inner circumferential surfaces of the upper mold and the lower mold and also provide a gap, which is to be filled with the resin, between the opposing flat surfaces of the first and second flat plate busbars, and, in this state, it is necessary to inject the insulating resin into the cavity while positionally securing the first and second flat plate busbars in the cavity.

Accordingly, there is a problem in that different upper and lower molds need to be provided in accordance with the specifications of busbar assemblies, such as the shapes and sizes of the first and second flat plate busbars and the thickness of the insulating resin.

Also, there is a problem in that it is difficult to spread the insulating resin throughout the gap between the opposing flat surfaces of the first and second flat plate busbars.

On the other hand, Patent Literature 2 discloses a method for manufacturing a busbar assembly, comprising a step of providing a plurality of flat plate busbars; a step of precipitating a heat-resistant and insulating coating film on each outer circumferential surface of the plurality of busbars by electrodeposition coating involving a coating material having heat resistance and insulating properties; a step of completely curing a coating film of a first busbar of the plurality of busbars; a step of partially curing a coating film of a second busbar of the plurality of busbars; and a step of placing the first busbar and the second busbar one on top of the other and performing a pressurizing and heating treatment to thereby cause the coating film of the second busbar to transition from a semi-cured state to a fully cured state and mechanically connect the first and second busbars in a laminated state by the coating film that has transitioned from the semi-cured state to the fully cured state.

Although the manufacturing method described in Patent Literature 2 is useful by being capable of eliminating the disadvantages of the manufacturing method described in Patent Literature 1, a coating film needs to be precipitated for each of the plurality of busbars, and, moreover, when adhering the first busbar and the second busbar, a securing structure that secures the busbars in their relative positions required in the final product form is needed.

PRIOR ART DOCUMENT

Patent Literature

Patent Literature 1: Japanese Patent No. 4432913
Patent Literature 1: JP 2016-216766A

DISCLOSURE OF THE INVENTION

The present invention has been conceived in view of the conventional art described above, and an object of the present invention is to provide a method for manufacturing a busbar assembly, the method being capable of reliably ensuring electrical insulation between a plurality of busbars and capable of efficiently manufacturing a busbar assembly in which the plurality of busbars are placed in their desired relative positions.

In order to achieve the object, the present invention provides a method for manufacturing a busbar assembly wherein a plurality of busbars are electrically insulated and mechanically connected by an insulating resin layer, the method including a step of providing a first conductive metal flat plate having a busbar assembly forming region; a slit forming step of forming a slit in the busbar assembly forming region, wherein the slit penetrates a first surface on one side in a thickness direction and a second surface on the other side in the thickness direction; a busbar-side coating step of coating the first conductive metal flat plate with a coating material containing an insulating resin such that at least the slit is filled with the insulating resin layer; a busbar-side curing step of curing the coating material applied in the busbar-side coating step to form the insulating resin layer; and a cutting step of cutting off the insulating resin layer in the slit and busbar forming parts of the first conductive metal flat plate from the first conductive metal flat plate, wherein the busbar forming parts face each other with the slit therebetween.

According to the manufacturing method of this invention, it is possible to efficiently manufacture a busbar assembly in which a plurality of busbars are precisely disposed in the desired relative positions while reliably ensuring electrical insulation between the plurality of busbars.

Preferably, the busbar-side coating step is performed by electrodeposition coating.

Alternatively, the busbar-side coating step can be performed by electrostatic powder coating.

One aspect of the manufacturing method according to the present invention includes a step of masking at least a part of the first surface of the busbar forming parts with a mask before the busbar-side coating step; and a step of removing the mask and forming a plated layer in a region, from which the mask has been removed, of the busbar forming parts before the cutting step.

The first conductive metal flat plate used in the manufacturing method according to the present invention is configured such that, after the slit forming step, the busbar forming parts facing each other with the slit therebetween are connected to each other via a connecting part of the first conductive metal flat plate located more toward one side in a longitudinal direction of the slit than the slit is and a connecting part of the first conductive metal flat plate located more toward the other side in the longitudinal direction of the slit than the slit is.

In this case, the cutting step includes a process of cutting the first conductive metal flat plate in a thickness direction along a cutting line set so as to cross the slit in a width direction on one side in the longitudinal direction of the slit and a process of cutting the first conductive metal flat plate in the thickness direction along a cutting line set so as to cross the slit in the width direction on the other side in the longitudinal direction of the slit.

In a preferable embodiment, the first conductive metal flat plate has a plurality of busbar assembly forming regions disposed in an X direction in an X-Y plane where the first conductive metal flat plate is located, and connecting regions for connecting the busbar assembly forming regions adjacent in the X direction; and the slit extends in the X direction.

In a more preferable embodiment, the first conductive metal flat plate is configured to have a plurality of busbar assembly forming strips each including the plurality of busbar assembly forming regions arranged in the X direction and the connecting regions connecting the busbar assembly forming regions adjacent in the X direction, wherein the plurality of busbar assembly forming strips are disposed in parallel in the Y direction; a first connecting strip for connecting end parts on one side in the X direction of the plurality of busbar assembly forming strips to each other; and a second connecting strip for connecting end parts on the other side in the X direction of the plurality of busbar assembly forming strips to each other.

In any one of the above configurations of the present invention, an opening width of the slit may narrow from one of the first surface and the second surface toward the other.

In one embodiment, the manufacturing method according to the present invention includes, before the cutting step, a step of providing a second conductive metal flat plate different from the first conductive metal flat plate, wherein the second conductive metal flat plate has a frame forming region corresponding to the busbar assembly forming region; a step of punching out an inner part surrounded by a circumferential part of the frame forming region so as to retain the circumferential part; a frame-side coating step of applying a coating material containing an insulating resin to an outer circumferential surface of the circumferential part of the frame forming region; a frame-side curing step of curing the coating material applied in the frame-side coating step to form a frame-side insulating resin layer, wherein at least one of the frame-side curing step and the busbar-side curing step is configured so as to form a semi-cured insulating resin layer; and an attachment step of curing the semi-cured insulating resin layer, with the busbar assembly forming region and the frame forming region being placed one on top of the other, to thereby cause the circumferential part and the busbar assembly forming region to adhere to each other.

In this case, the cutting step comprises a process of cutting off the circumferential part from the second conductive metal flat plate in addition to the process of cutting off the insulating resin layer in the slit and the busbar forming parts from the first conductive metal flat plate wherein the busbar forming parts face each other with the slit therebetween.

BRIEF DESCRIPTION OF THE DRAWINGS

FIG. 19A is an enlarged plan view corresponding to FIG. 18A, and FIG. 19B is a cross-sectional view taken along the line XIXb-XIXb in FIG. 19A.

EMBODIMENT FOR CARRYING OUT THE INVENTION

First Embodiment

Below, one embodiment of the method for manufacturing a busbar assembly according to the present invention will now be described with reference to the appended drawings.

Figure 1A:
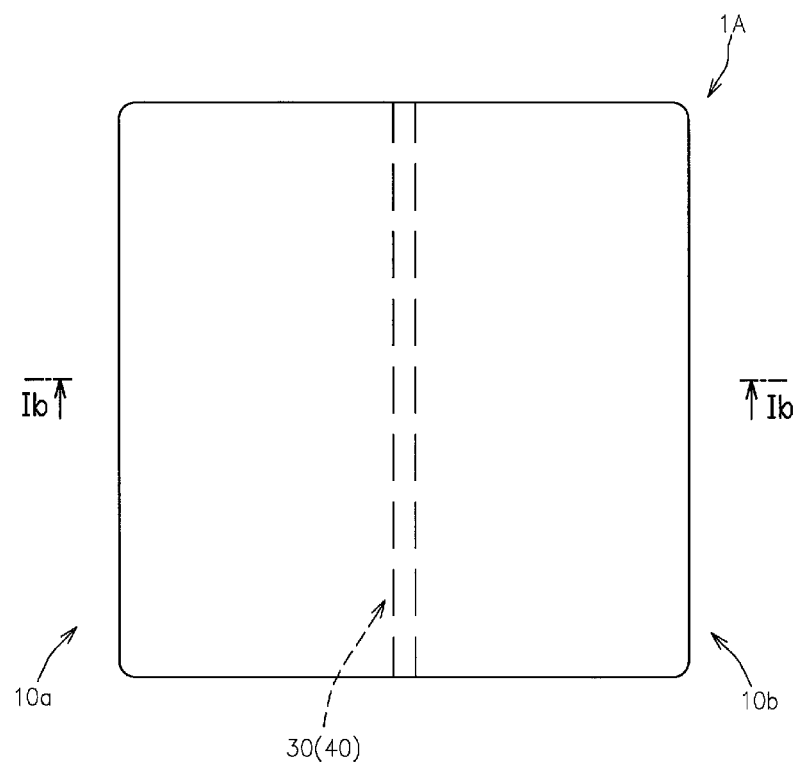
FIG. 1A is a plan view of a busbar assembly manufactured by a manufacturing method according to a first embodiment of the present invention.
Figure 1B:
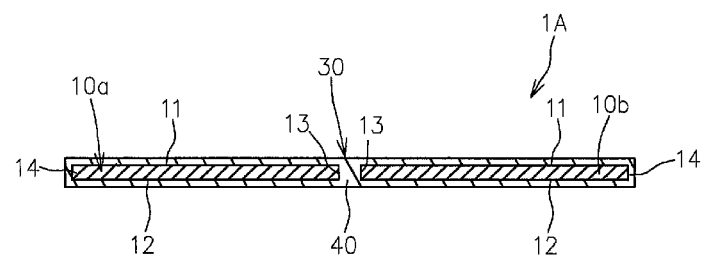
FIG. 1B is a cross-sectional view taken along the line Ib-Ib in FIG. 1A.

FIG. 1A shows a plan view of a busbar assembly 1A manufactured by the manufacturing method according to the present embodiment, and FIG. 1B shows a cross-sectional view taken along the line Ib-Ib in FIG. 1A.

First, the busbar assembly 1A will now be described.

As shown in FIG. 1A and FIG. 1B, the busbar assembly 1A has conductive first and second busbars 10a, 10b disposed in the same plane, with a gap 40 being provided between the opposing side surfaces thereof and a busbar-side insulating resin layer 30 filled in the gap 40 between the opposing side surfaces of the first and second busbars 10a, 10b, wherein the busbar-side insulating resin layer 30 electrically insulates and mechanically connects the first and second busbars 10a, 10b.

As shown in FIG. 1B, the first and second busbars 10a, 10b have first surfaces 11 on one side in the thickness direction, second surfaces 12 on the other side in the thickness direction, opposing side surfaces 13 facing each other, and outer side surfaces 14 facing mutually opposite directions as viewed in a cross-sectional diagram taken in the thickness direction.

The first and second busbars 10a, 10b are formed of a conductive metal flat plate of Cu or the like.

One of the first and second busbars 10a, 10b functions as a positive electrode, and the other functions as a negative electrode.

The busbar-side insulating resin layer 30 is formed of a resin having heat resistance and insulating properties, and, for example, polyimide, polyamide, epoxy, or the like is preferably used.

In the busbar assembly 1A, the insulating resin layer 30 fills the gap 40 between the opposing side surfaces 13 of the first and second busbars 10a, 10b and covers the first surfaces 11, the second surfaces 12, and the outer side surfaces 14 of the first and second busbars 10a, 10b.

Figure 1C:
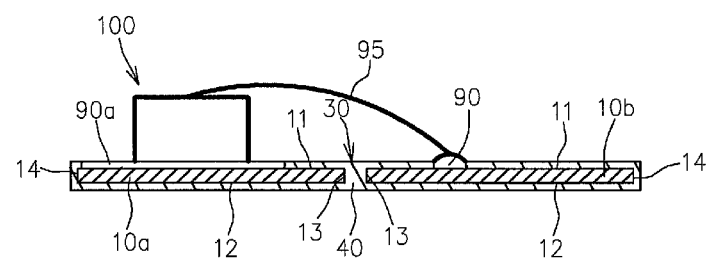
FIG. 1C is a cross-sectional view taken along the same line as FIG. 1B in a state where a semiconductor element is attached to the busbar assembly.

FIG. 1C shows a cross-sectional view of the busbar assembly 1A to which a semiconductor element 92 such as an LED is attached.

In the embodiment shown in FIG. 1C, the semiconductor element 92 has one of the positive electrode and the negative electrode on the lower surface and the other of the positive electrode and the negative electrode on the upper surface.

In this case, the lower surface of the semiconductor element 92 is die-bonded so as to be electrically connected to a first plated layer 90a provided on the first surface 11 of one of the first and second busbars 10a, 10b (the first busbar 10a in the depicted embodiment), and the upper surface is electrically connected to a second plated layer 90b provided on the first surface 11 of the other of the first and second busbars 10a, 10b (the second busbar 10b in the depicted embodiment) via wire bonding 95.

Next, a method for manufacturing the busbar assembly 1A will now be described.

The manufacturing method according to the present embodiment has a step of providing a first conductive metal flat plate 100 having a busbar assembly forming region 120 having the same thickness as the first and second busbars 10a, 10b; and a slit forming step of forming a slit 125 in the busbar assembly forming region 120, wherein the slit 125 penetrates a first surface 121 on one side in the thickness direction and a second surface 122 on the other side in the thickness direction.

Figure 2:
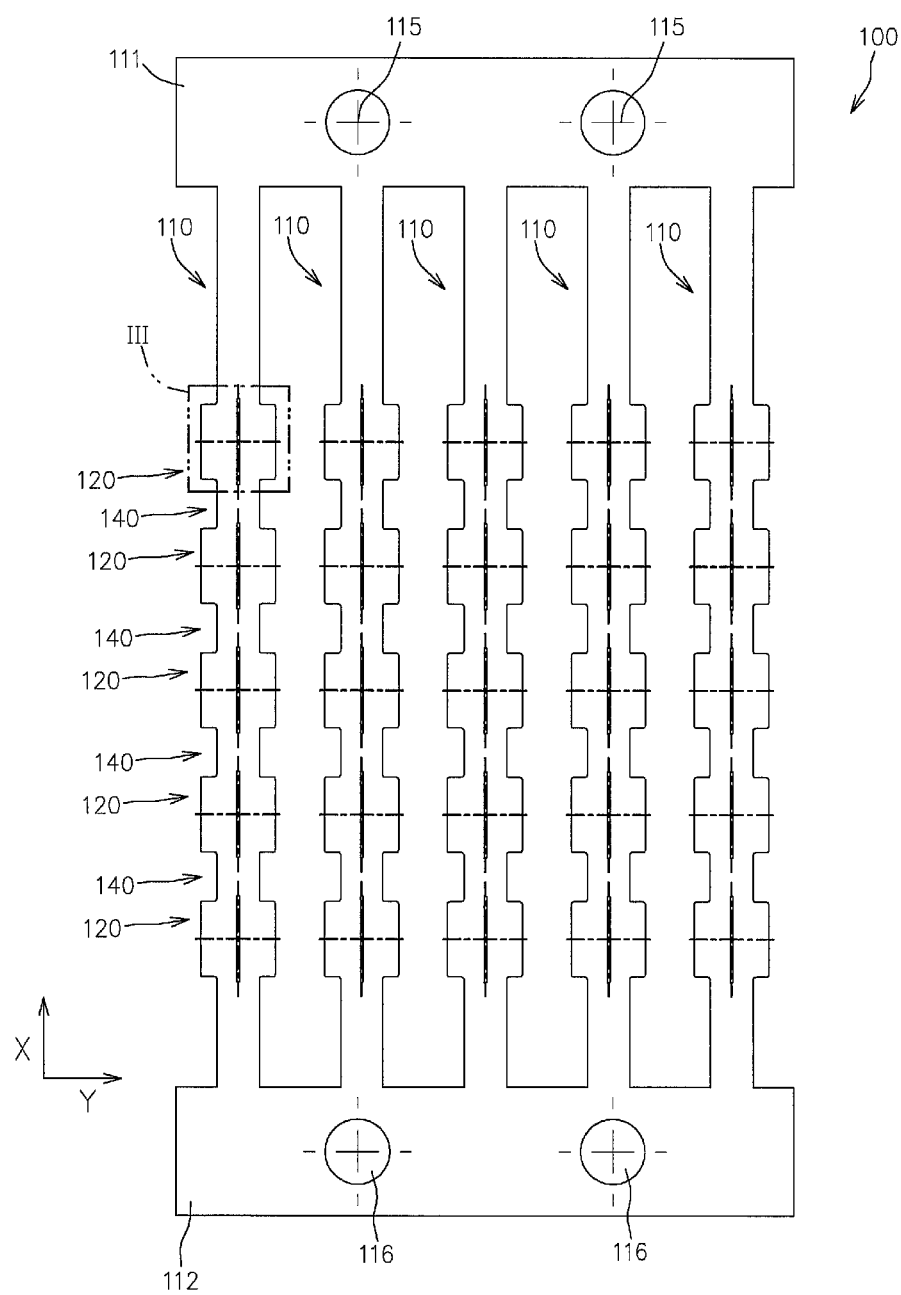
FIG. 2 is a plan view of a first conductive metal flat plate used in the manufacturing method according to the first embodiment, and shows a state after a slit forming step of the manufacturing method is complete.

FIG. 2 shows a plan view of the first conductive metal flat plate 100 after the slit forming step is complete.

Figure 3A:
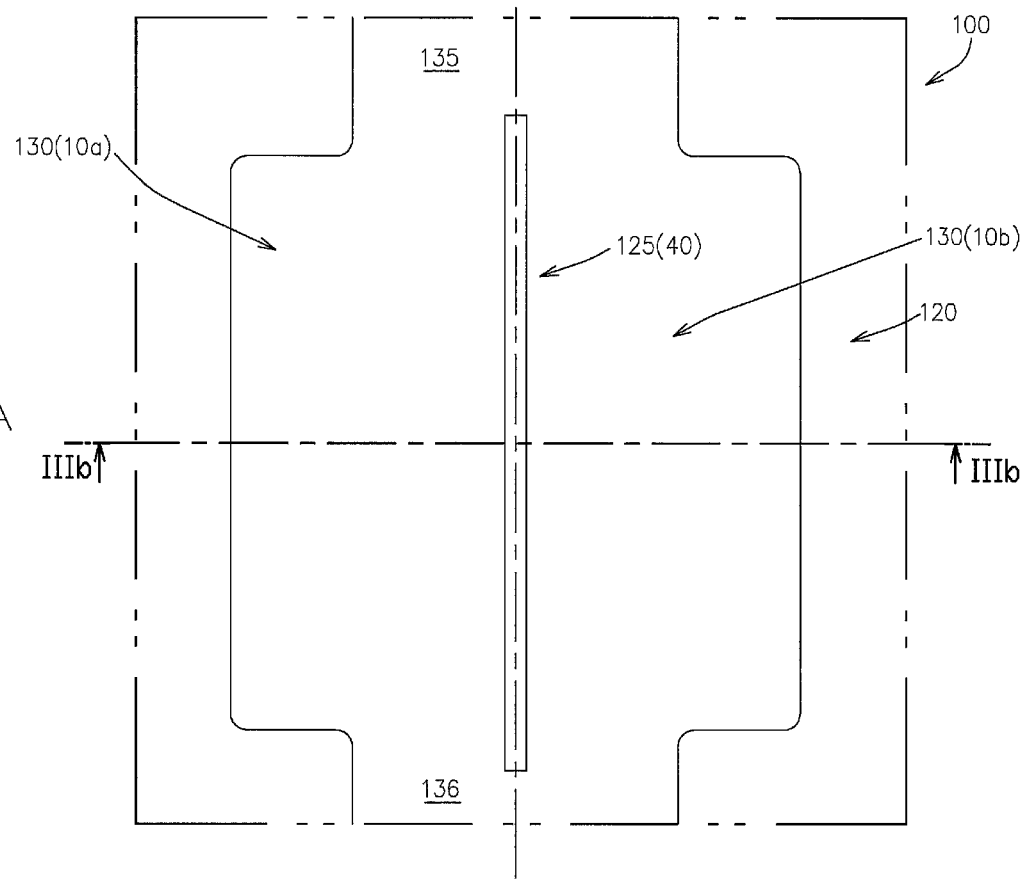
FIG. 3A is an enlarged view of a busbar assembly forming region shown by the III part in FIG. 2.
Figure 3B:
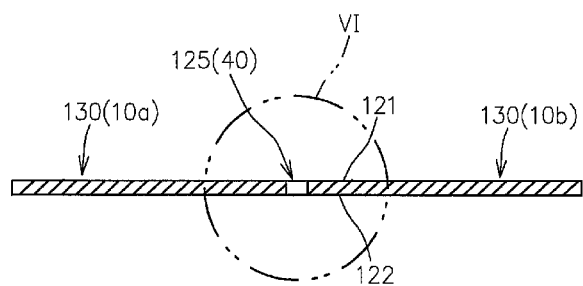
FIG. 3B is a cross-sectional view taken along the line in FIG. 3A.

FIG. 3A shows an enlarged view of the III part in FIG. 2, and FIG. 3B shows a cross-sectional view taken along the line in FIG. 3A.

The slit 125 forms the gap 40 between the opposing side surfaces 13 of the first and second busbars 10a, 10b in the busbar assembly 1A. The width of the gap 40, i.e., the width of the slit 125, is determined in accordance with the specifications of the busbar assembly 1A.

As shown in FIG. 3(a) and FIG. 3(b), in the present embodiment, the first conductive metal flat plate 100 after the slit forming step is configured such that a pair of busbar forming parts 130, 130 facing each other with the slit 125 therebetween remain connected to each other via a connecting part 135 of the first conductive metal flat plate 100 located more toward one side in the longitudinal direction of the slit 125 than the slit 125 is and a connecting part 136 of the first conductive metal flat plate 100 located more toward the other side in the longitudinal direction of the slit 125 than the slit 125 is.

Due to this configuration, the slit 125 can be formed highly accurately.

In the present embodiment, as shown in FIG. 2, the first conductive metal flat plate 100 has a plurality of busbar assembly forming regions 120 disposed in the X direction in the X-Y plane where the first conductive metal flat plate 100 is located, and connecting regions 140 for connecting the busbar assembly forming regions 120 adjacent in the X direction, and thus the plurality of busbar assembly forming regions 120 can be simultaneously processed.

In the embodiment shown in FIG. 2, five busbar assembly forming regions 120 are disposed in series in the X direction (in the top-bottom direction of the drawing).

Moreover, in the present embodiment, as shown in FIG. 2, a busbar assembly forming strip 110 is formed of the plurality of busbar assembly forming regions 120 disposed in the X direction and the connecting regions 140 connecting the busbar assembly forming regions 120 adjacent in the X direction, and a plurality of busbar assembly forming strips 110 are disposed in parallel in the Y direction perpendicular to the X direction in the X-Y plane.

Specifically, in the embodiment shown in FIG. 2, the first conductive metal flat plate 100 has a plurality of (five in the depicted embodiment) busbar assembly forming strips 110 disposed in parallel in the Y direction, a busbar-side first connecting strip 111 for connecting the end parts on one side in the X direction of the plurality of busbar assembly forming strips 110 to each other, and a busbar-side second connecting strip 112 for connecting the end parts on the other side in the X direction of the plurality of busbar assembly forming strips 110 to each other.

With the first conductive metal flat plate 100 thus configured, a greater number of busbar assemblies 1A can be simultaneously manufactured.

The manufacturing method according to the present embodiment includes, after the slit forming step, a busbar-side coating step of coating the first conductive metal flat plate 100 with a coating material containing an insulating resin such that at least the slit 125 is filled with the insulating resin layer 30, and a busbar-side curing step of curing the coating material applied in the busbar-side coating step to form the insulating resin layer 30.

Figure 4:
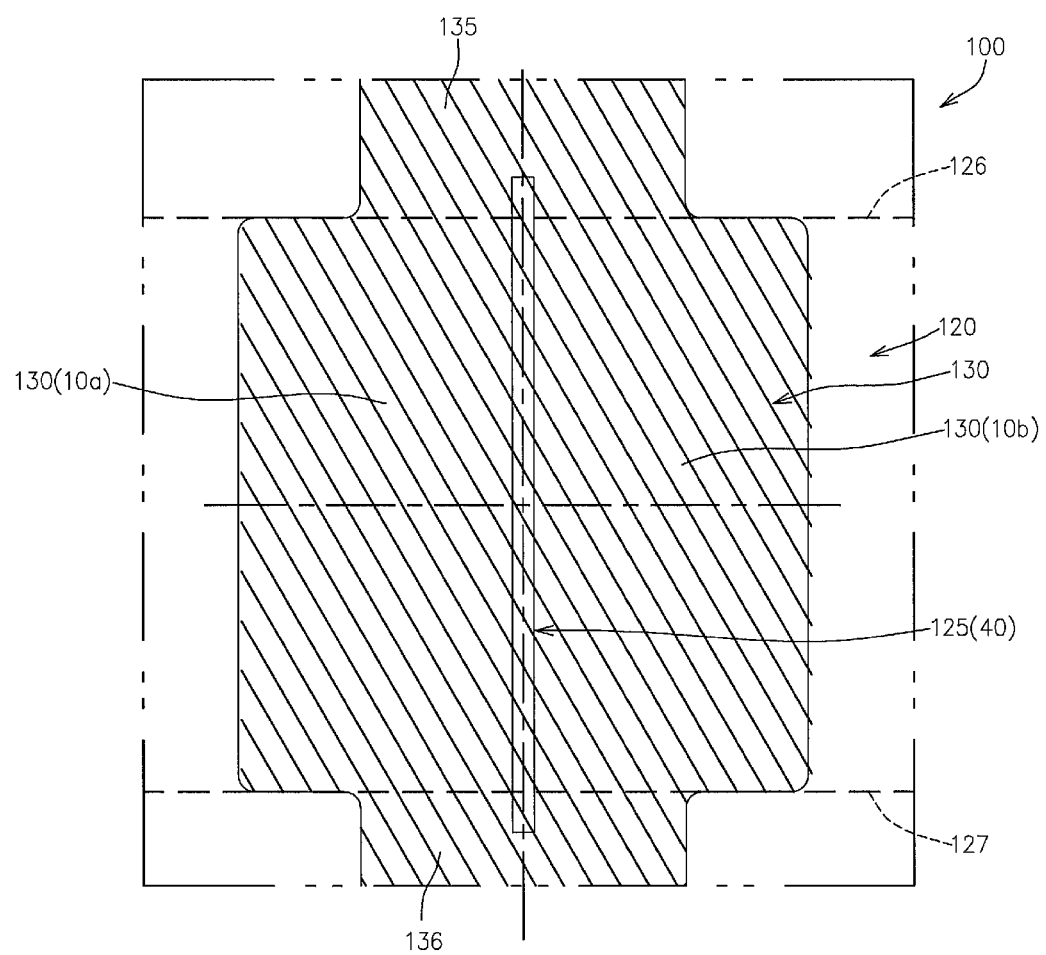
FIG. 4 is an enlarged plan view of the busbar assembly forming region, and shows a state after a busbar-side curing step of the manufacturing method is complete.

FIG. 4 shows an enlarged plan view of the busbar assembly forming region 120 at the time when the busbar-side curing step is complete.

The busbar-side coating step is performed by electrodeposition coating involving an electrodeposition coating material containing an insulating resin having heat resistance and insulating properties, such as polyimide, polyamide, or epoxy.

Alternatively, the busbar-side coating step can be performed by electrostatic powder coating involving powders of the insulating resin.

Also, in a case where the filling of the resin into the slit 125 can be sufficiently ensured, the busbar-side coating step can be performed by spray coating.

The busbar-side curing step is performed by thermally treating the coating material applied in the busbar-side coating step at a suitable temperature.

The manufacturing method according to the present embodiment has, after the busbar-side curing step, a cutting step of cutting off the insulating resin layer 30 in the slit 125 and the pair of busbar forming parts 130 of the first conductive metal flat plate 100 from the first conductive metal flat plate 100, wherein the busbar forming parts 130 face each other with the slit 125 therebetween.

In the present embodiment, as described above, the busbar forming parts 130 facing each other with the slit 125 therebetween are connected to each other via the connecting part 135 of the first conductive metal flat plate 100 located more toward one side in the longitudinal direction of the slit 125 than the slit 125 is and the connecting part 136 of the first conductive metal flat plate 100 located more toward the other side in the longitudinal direction of the slit 125 than the slit 125 is.

In this case, as shown in FIG. 4, the cutting step includes a process of cutting the first conductive metal flat plate 100 in the thickness direction along a cutting line 126 set so as to cross the slit 125 in the width direction on one side in the longitudinal direction of the slit 125 and a process of cutting the first conductive metal flat plate 100 in the thickness direction along a cutting line 127 set so as to cross the slit 125 in the width direction on the other side in the longitudinal direction of the slit 125.

As in the present embodiment, in a case where the first conductive metal flat plate 100 has the plurality of busbar assembly forming regions 120 disposed in the X direction and the connecting regions 140 for connecting the busbar assembly forming regions 120 adjacent in the X direction, the slit 125 is formed such that its longitudinal direction is in the X direction.

According to the manufacturing method of the present embodiment having this configuration, the busbar assembly 1A shown in FIG. 1, i.e., the busbar assembly 1A in which the first and second busbars 10, 20 are electrically insulated and mechanically connected by the insulating resin layer 30, can be efficiently manufactured.

That is to say, in the manufacturing method, with the relative positions of the pair of busbar forming parts 130 for forming the first and second busbars 10a, 10b being secured, the insulating resin layer 30 is filled into the slit 125 between the pair of busbar forming parts 130, and then the pair of busbar forming parts 130 and the insulating resin layer 30 are cut out from the first conductive metal flat plate 100, and thus the busbar assembly 1A in which the first and second busbars 10a, 10b are electrically insulated and mechanically connected by the insulating resin layer 30 is manufactured.

Accordingly, it is possible to efficiently manufacture the busbar assembly 1A in which the first and second busbars 10a, 10b are precisely disposed in the desired relative positions while reliably ensuring electrical insulation between the first and second busbars 10a, 10b.

The case where the busbar assembly 1A including two busbars, i.e., the first and second busbars 10a, 10b, is manufactured has been described as an example, but the manufacturing method according to the present embodiment is capable of manufacturing a busbar assembly having three or more busbars by increasing the number of slits 125.

Figure 5A:
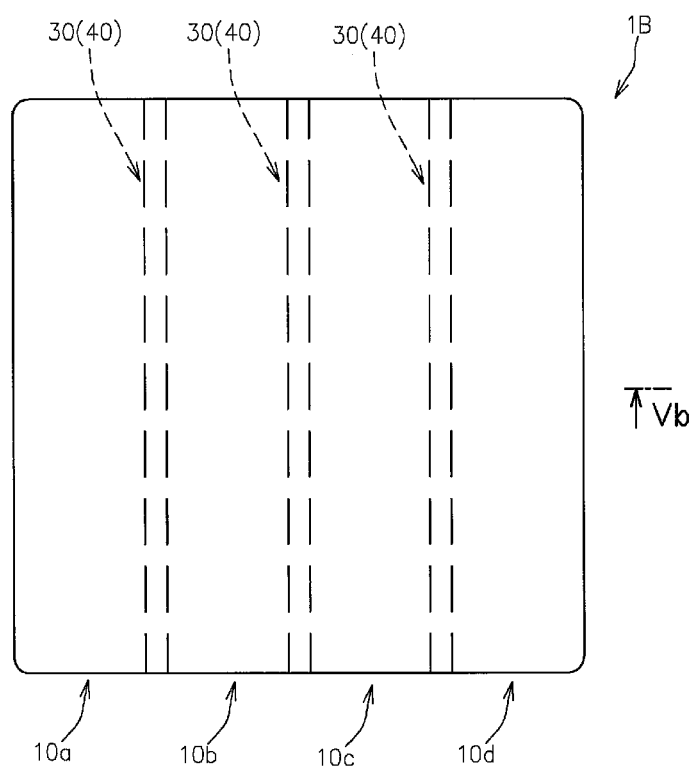
FIG. 5A is a plan view of a busbar assembly manufactured by a manufacturing method according to a modification of the first embodiment.
Figure 5B:
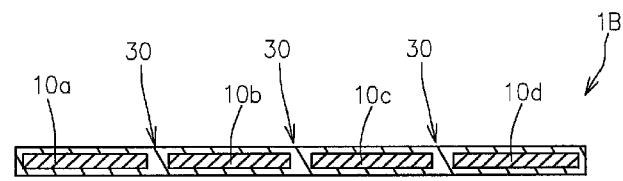
FIG. 5B is a cross-sectional view taken along the line Vb-Vb in FIG. 5A.

FIG. 5A shows a plan view of a busbar assembly 1B manufactured using three slits 125, and FIG. 5B shows a cross-sectional view taken along the line Vb-Vb in FIG. 5A.

The busbar assembly 1B has three gaps 40 formed by three slits 125, and four busbars 10a to 10d are electrically insulated and mechanically connected by the insulating resin layer 30 filled in the three gaps 40.

In the busbar assembly 1A manufactured by the manufacturing method according to the present embodiment, the opening width of the slit 125 is constant in the thickness direction. Alternatively, a slit having an opening width that is varied in the thickness direction can be formed as well.

Figure 6A:
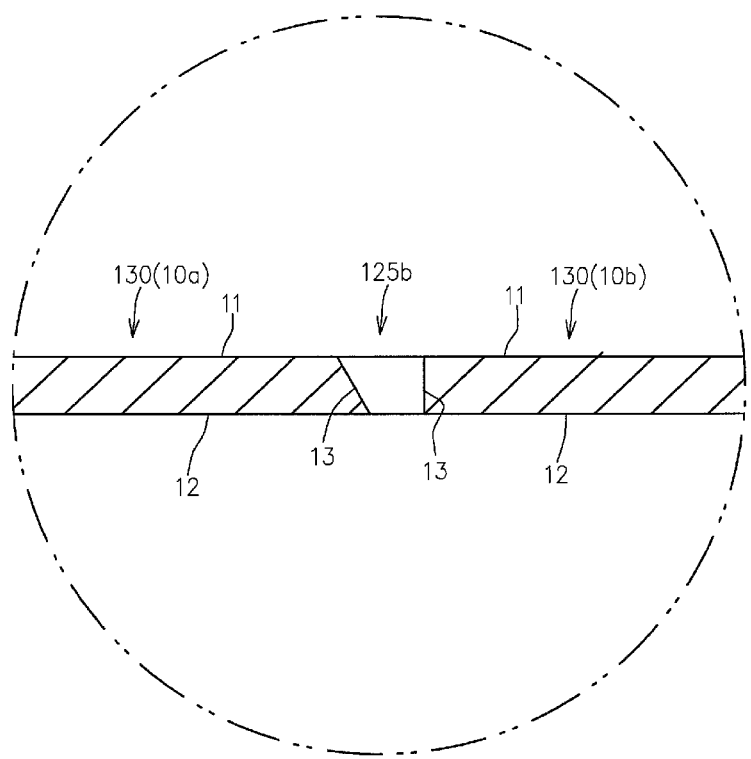
FIG. 6A is an enlarged cross-sectional view corresponding to the VI part in FIG. 3, and shows a state during the course of manufacture in a manufacturing method according to another modification of the first embodiment.

FIG. 6A shows an enlarged cross-sectional view corresponding to the VI part in FIG. 3 and taken during the course of manufacture in the manufacturing method according to a modification of the present embodiment.

In the modification shown in FIG. 6A, a slit 125b is formed such that the opposing side surface 13 of the second busbar 10b is a vertical surface extending in the thickness direction, and the opposing side surface 13 of the first busbar 10a is an inclined surface that is closer to the opposing side surface 13 of the second busbar 10b on the second surface 12 side than the first surface 11 side.

Figure 6B:
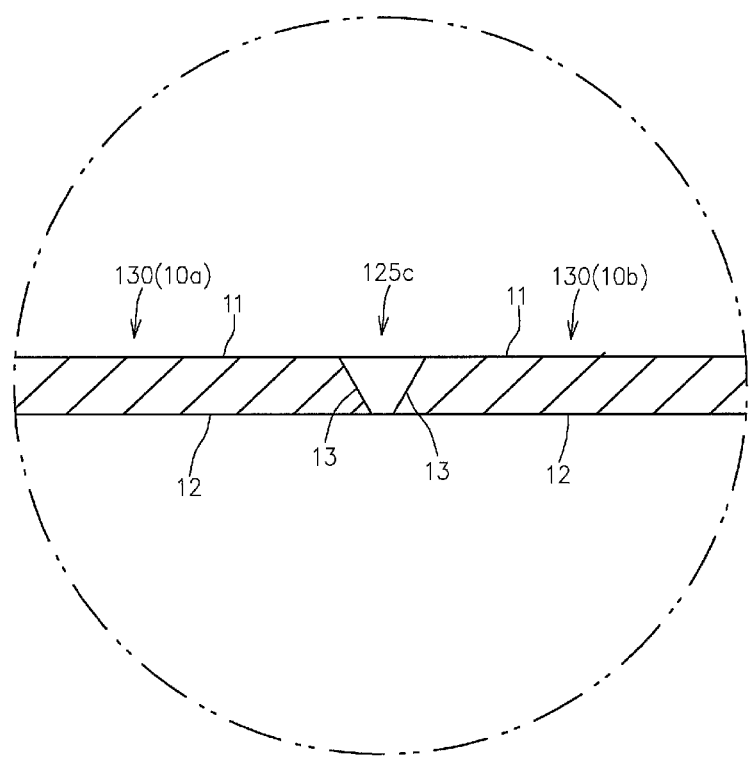
FIG. 6B is an enlarged cross-sectional view corresponding to FIG. 6A, and shows a state during the course of manufacture in a manufacturing method according to still another modification of the first embodiment.

FIG. 6B shows an enlarged cross-sectional view corresponding to the VI part in FIG. 3 and taken during the course of manufacture in the manufacturing method according to another modification of the present embodiment.

In the modification shown in FIG. 6B, a slit 125c is formed such that the opposing side surface 13 of the first busbar 10a is an inclined surface that is closer to the opposing side surface 13 of the second busbar 10b on the second surface 12 side than the first surface 11 side, and the opposing side surface 13 of the second busbar 10b is an inclined surface that is closer to the opposing side surface of the first busbar 10a on the second surface 12 side than the first surface 11 side.

Thus, according to the manufacturing method of the present embodiment, changing the shape of the slit makes it possible to easily alter the shape and size of the gap 40 between a plurality of busbars 10, i.e., the shape and size of the insulating resin layer 30 that is filled in the gap 40 and that electrically insulates and mechanically connects the plurality of busbars 10.

Second Embodiment

Below, another embodiment of the method for manufacturing a busbar assembly according to the present invention will now be described with reference to the appended drawings.

In the drawings of the present embodiment, the same components as those in the first embodiment are given the same reference numbers, and descriptions thereof are omitted as appropriate.

Figure 7:
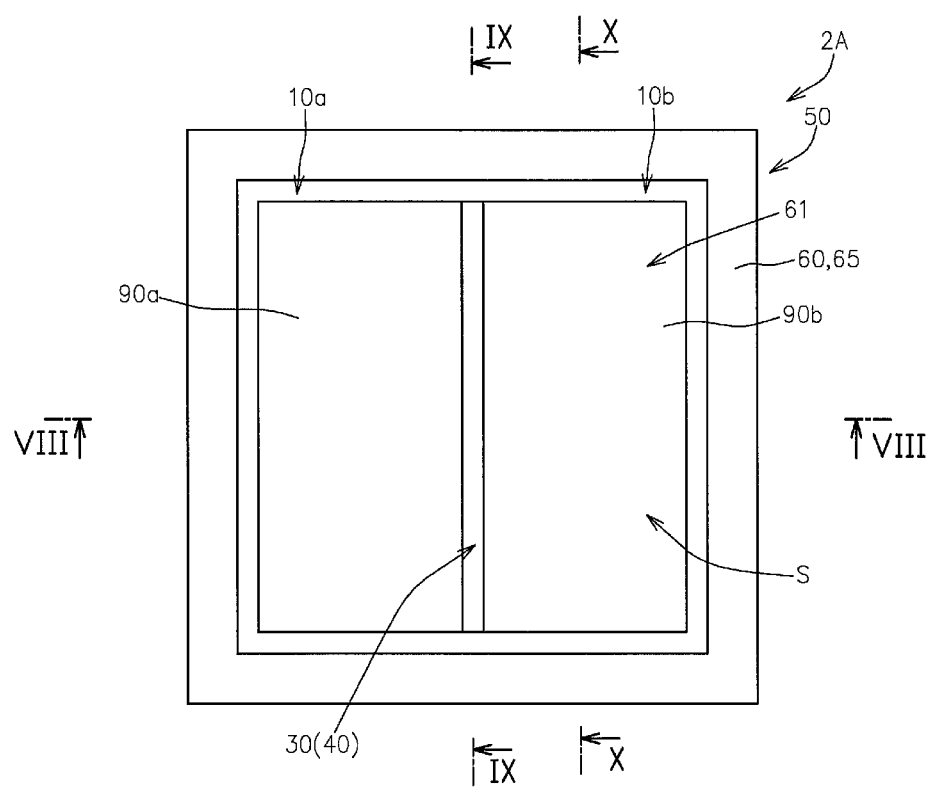
FIG. 7 is a plan view of a busbar assembly manufactured by a manufacturing method according to a second embodiment of the present invention.

FIG. 7 is a plan view of a busbar assembly 2A manufactured by the manufacturing method according to the present embodiment.

Figure 8:
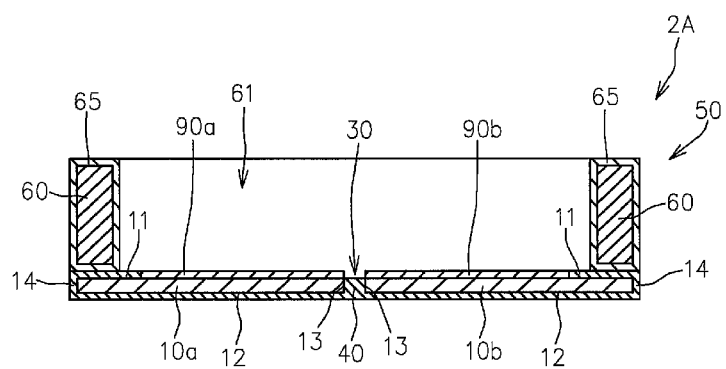
FIG. 8 is a cross-sectional view taken along the line VIII-VIII in FIG. 7.
Figure 9:
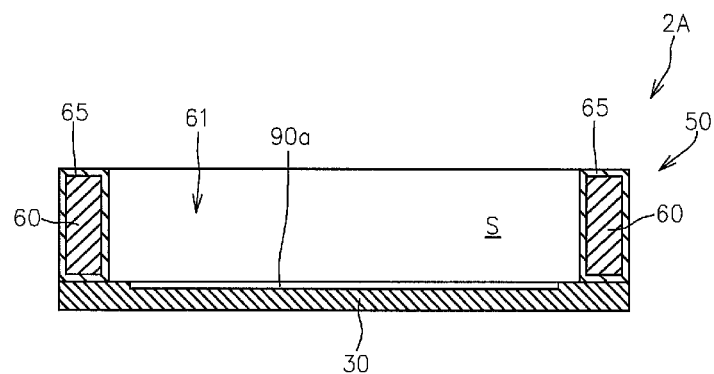
FIG. 9 is a cross-sectional view taken along the line IX-IX in FIG. 7.
Figure 10:
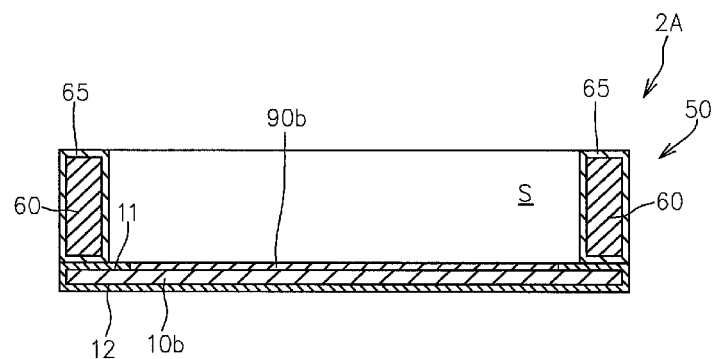
FIG. 10 is a cross-sectional view taken along the line X-X in FIG. 7.

FIG. 8 to FIG. 10 respectively show cross-sectional views taken along the lines VIII-VIII, IX-IX, and X-X in FIG. 7.

First, the busbar assembly 2A will now be described

As shown in FIG. 7 to FIG. 10, the busbar assembly 2A has the first and second busbars 10a, 10b and the busbar-side insulating resin layer 30 as in the busbar assembly 1A of the first embodiment.

The busbar assembly 2A further has the first and second plated layers 90a, 90b provided on the first surfaces 11 (the upper surfaces in the depicted embodiment) of the first and second busbars 10a, 10b, respectively.

Figure 11:
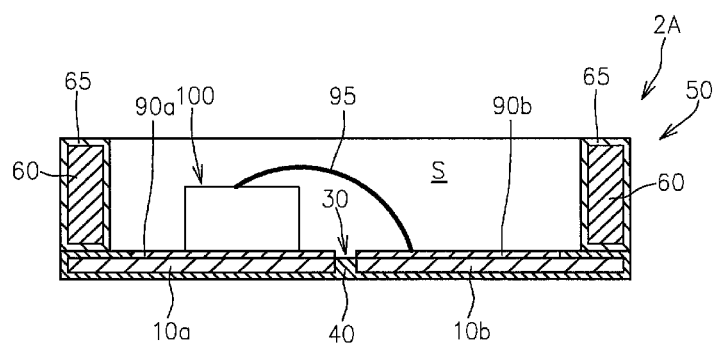
FIG. 11 is a cross-sectional view corresponding to FIG. 8 of the busbar assembly to which a semiconductor element is attached.

FIG. 11 shows a cross-sectional view corresponding to FIG. 8 of the busbar assembly 2A to which the semiconductor element 92 such as an LED is attached.

The semiconductor element 92 has one of the positive electrode and the negative electrode on the lower surface and the other of the positive electrode and the negative electrode on the upper surface.

In this case, the lower surface of the semiconductor element 92 is die-bonded so as to be electrically connected to the first plated layer 90a provided on one of the first and second busbars 10a, 10b (the first busbar 10a in the depicted embodiment), and the upper surface is electrically connected to the second plated layer 90b provided on the other of the first and second busbars 10a, 10b (the second busbar 10b in the depicted embodiment) via wire bonding 95.

As shown in FIG. 7 to FIG. 11, the busbar assembly 2A further has a frame 50 adhered to the first surfaces of the first and second busbars 10a, 10b.

The frame 50 has a cylinder shape having a central hole 61 penetrating in the axial direction.

The frame 50 is adhered to the first surfaces 11 of the first and second busbars 10a, 10b so as to match the circumferential edges of the first and second busbars 10a, 10b as viewed from above, and defines a mount space S that surrounds the semiconductor element 92 attached to the busbar assembly 2A and that is open upward.

The frame 50 has a cylinder shape frame body 60 having the central hole 61 penetrating in the axial direction and a frame-side insulating resin layer 65 covering the outer circumferential surface of the frame body 60.

The frame body 60 can be formed by, for example, pressing a metal flat plate having a thickness corresponding to the length in the axial direction of the frame body 60 to form the central hole 61.

The frame-side insulating resin layer 65 is formed of, for example, polyimide, polyamide, epoxy, or the like.

An insulating resin (not shown) such as epoxy is injected into the mount space S after the semiconductor element 92 is attached, and thus the semiconductor element 92 is encapsulated within the resin.

Next, a method for manufacturing the busbar assembly 2A will now be described.

The manufacturing method according to the present embodiment is the same as the manufacturing method according to the first embodiment with respect to including the step of providing the first conductive metal flat plate 100 and the slit forming step (see FIG. 2 and FIG. 3).

On the other hand, the manufacturing method according to the present embodiment is different from the manufacturing method according to the first embodiment with respect to including a step of masking with a mask 190 at least a part of the first surfaces on one side in the thickness direction of the busbar forming parts 130 for forming the first and second busbars 10a, 10b before the busbar-side coating step, and including a step of removing the mask 190 and forming the first and second plated layers 90a, 90b in a region, from which the mask 190 has been removed, of the busbar forming parts 130 before the cutting step.

Figure 12:
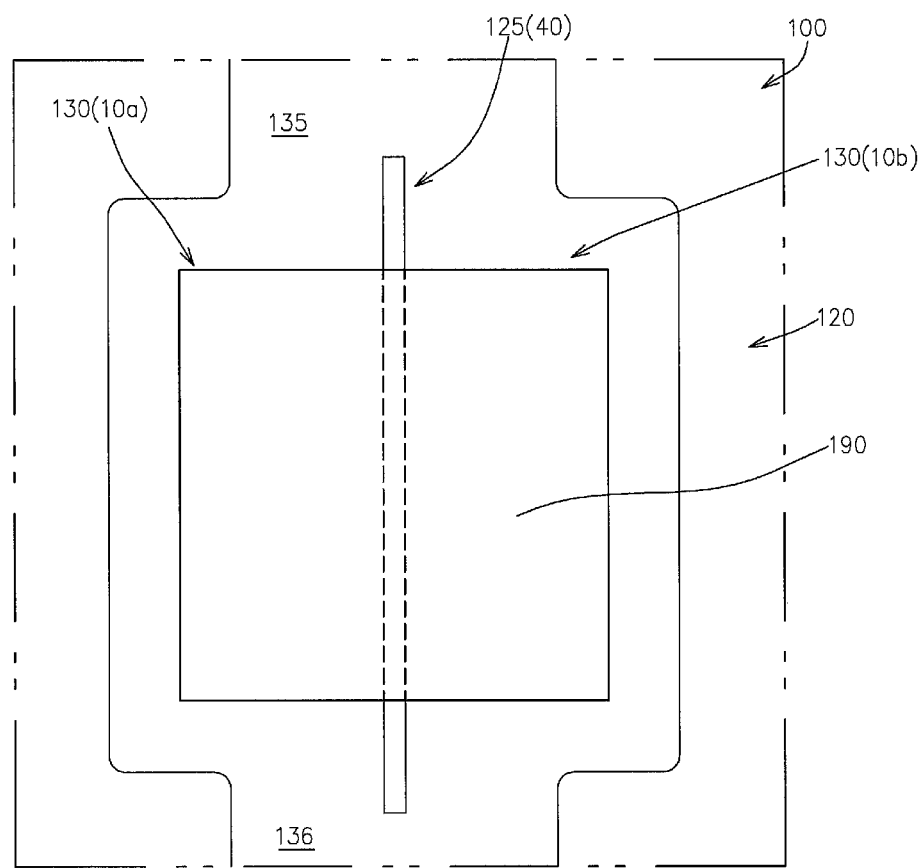
FIG. 12 is an enlarged plan view of a busbar assembly forming region of a first conductive metal flat plate used in the manufacturing method according to the second embodiment, and shows a state after a masking step is complete.

FIG. 12 shows an enlarged plan view of the busbar assembly forming region at the time when the masking step is complete.

As shown in FIG. 12, the mask 190 provided in the masking step has a shape and a size so as to cover regions of the first surfaces on one side in the thickness direction of the busbar forming parts 130 for forming the first and second busbars 10a, 10b wherein the regions are to be provided with the first and second plated layers 90a, 90b (hereinafter referred to as plated layer forming regions).

In the manufacturing method according to the present embodiment, the busbar-side coating step and the busbar-side curing step are performed, with the mask 190 being provided on the busbar assembly forming region 120.

Figure 13A:
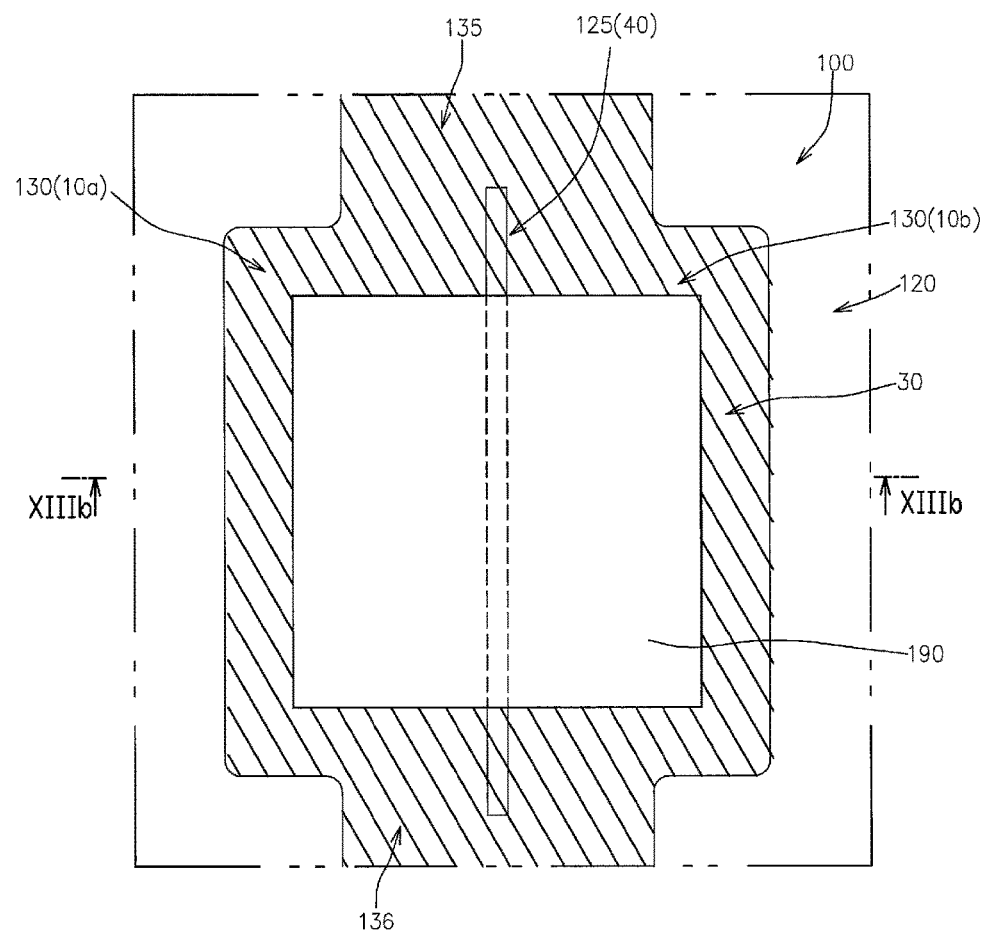
FIG. 13A is an enlarged plan view of the busbar assembly forming region and shows a state after a busbar-side curing step in the manufacturing method is complete.
Figure 13B:
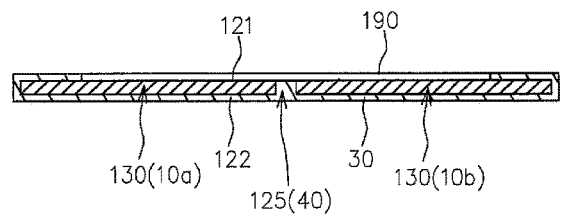
FIG. 13B is a cross-sectional view taken along the line XIIIb-XIIIb in FIG. 13A.

FIG. 13A is an enlarged plan view of the busbar assembly forming region 120 at the time when the busbar-side curing step is complete, and FIG. 13B is a cross-sectional view taken along the line XIIIb-XIIIb in FIG. 13A.

As shown in FIGS. 13A and 13B, since the plated layer forming region is covered with the mask 190, the insulating resin layer 30 is provided in a region of the first surface 121 of the busbar assembly forming region 120 excluding the plated layer forming region.

Masking is not performed on the second surface 122 of the busbar assembly forming region 120, and thus the entirety of the second surface 122 is exposed. Accordingly, in the busbar-side coating step, as the insulating resin layer 30 is provided on the entire second surface 122 of the busbar assembly forming region 120, the insulating resin enters the slit 125 from the second surface 122 side, and the slit 125 is also filled with the insulating resin layer 30.

Naturally, it is also possible to use, in place of the mask 190, a first mask for covering only a region where the first plated layer 90a is to be provided and a second mask for covering only a region where the second plated layer 90b is to be provided.

The manufacturing method according to the present embodiment includes a step of providing a second conductive metal flat plate 200 different from the first conductive metal flat plate 100 in parallel with, before, or after the busbar-side insulating resin forming process from the step of providing the first conductive metal flat plate 100 to the busbar-side curing step, wherein the second conductive metal flat plate 200 includes a frame forming region 220 having an outer circumferential shape corresponding to the busbar assembly forming region 120 as viewed from above and having the same thickness as the frame 60; a punching step of punching out a central part 235 of the frame forming region 220 so as to leave a circumferential part 230 of the frame forming region 220; a frame-side coating step of applying a coating material containing an insulating resin to the circumferential part 230 of the frame forming region 220; and a frame-side curing step of curing the coating material applied in the frame-side coating step to form the frame-side insulating resin layer 65.

Figure 14:
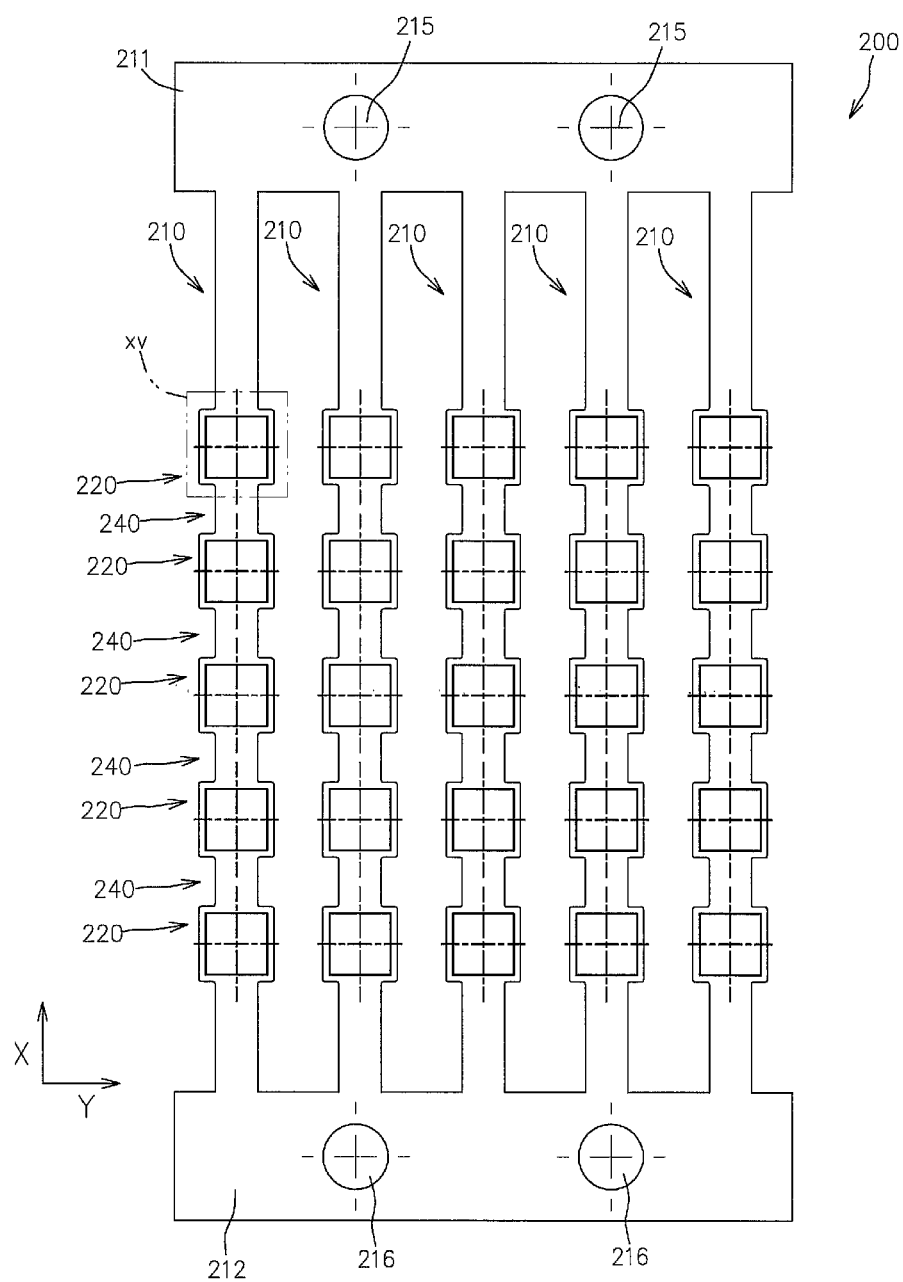
FIG. 14 is a plan view of a second conductive metal flat plate used in the manufacturing method according to the second embodiment, and shows a state after a punching step in the manufacturing method is complete.

FIG. 14 shows a plan view of the second conductive metal flat plate 200 at the time when the punching step is complete.

Figure 15A:
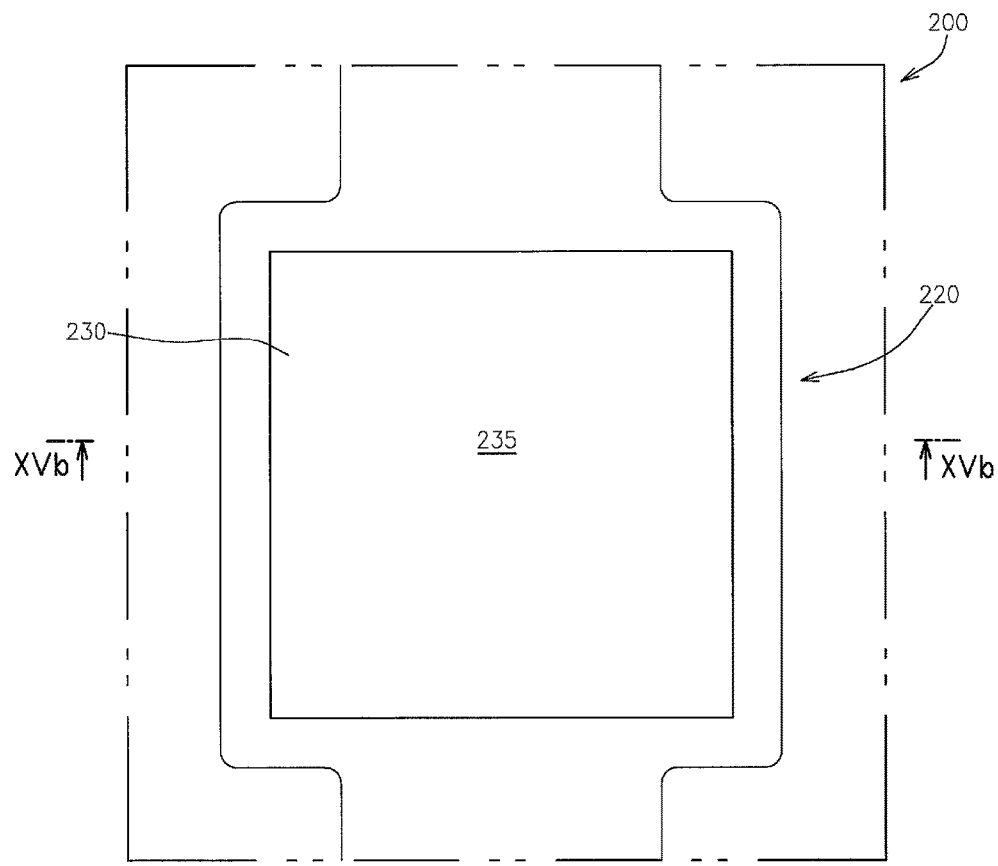
FIG. 15A is an enlarged view of a frame forming region shown by the XV part in FIG. 14.
Figure 15B:
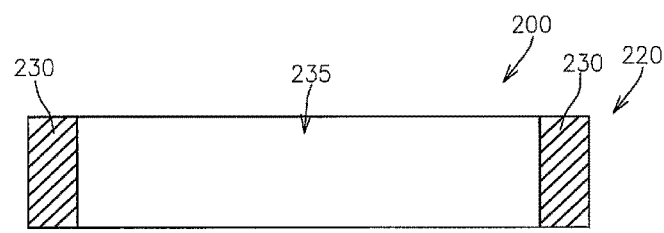
FIG. 15B is a cross-sectional view taken along the line XVb-XVb in FIG. 15A.

FIG. 15A shows an enlarged view of the XV part in FIG. 14, and FIG. 15B shows a cross-sectional view taken along the line XVb-XVb in FIG. 15A.

The second conductive metal flat plate 200 is configured such that the frame forming region 220 is aligned with the busbar assembly forming region 120 when placed on top of the first conductive metal flat plate 100.

Specifically, as described above, in the present embodiment, the first conductive metal flat plate 100 for forming the first and second busbars 10a, 10b has a plurality of busbar assembly forming strips 110 each including a plurality of busbar assembly forming regions 120 disposed in series in the X direction, wherein the plurality of busbar assembly forming strips 110 are disposed in parallel in the Y direction; a busbar-side first connecting strip 111 for connecting the end parts on one side in the X direction of the plurality of busbar assembly forming strips 110 to each other; and a busbar-side second connecting strip 112 for connecting the end parts on the other side in the X direction of the plurality of busbar assembly forming strips 110 to each other (see FIG. 2).

Accordingly, as shown in FIG. 14, the second conductive metal flat plate 200 has a plurality of frame forming strips 210 each having a plurality of frame forming regions 220 disposed in series in the X direction at the same interval as the plurality of busbar forming regions 120, wherein the plurality of frame forming regions 210 are disposed in parallel in the Y direction at the same interval as the plurality of busbar assembly forming strips 110; a frame-side first connecting strip 211 for connecting the end parts on one side in the X direction of the plurality of frame forming strips 210 to each other; and a frame-side second connecting strip 212 for connecting the end parts on the other side in the X direction of the plurality of frame forming strips 210 to each other.

In the punching step, the central part 235 is punched out such that the peripheral part 230 surrounds the plated layer forming region.

That is to say, the size of the part 235 to be punched out is determined such that the central hole 61 (see FIG. 7) is greater than the plated layer forming region as viewed from above.

The frame-side coating step is performed by electrodeposition coating involving an electrodeposition coating material containing an insulating resin having heat resistance and insulating properties, such as polyimide, polyamide, or epoxy.

Alternatively, the frame-side coating step can be performed by electrostatic powder coating involving powders of the insulating resin.

Also, the frame-side coating step can be performed by spray coating.

Figure 16:
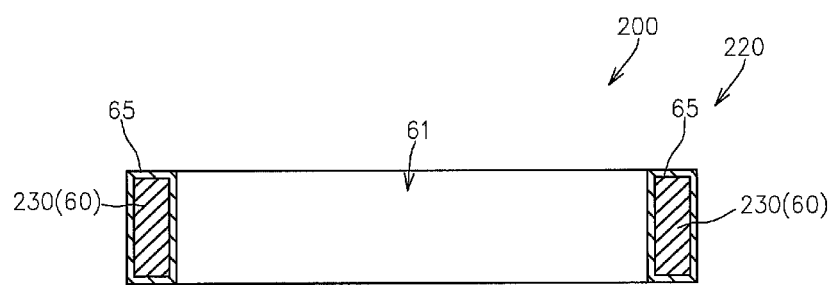
FIG. 16 is a cross-sectional view corresponding to FIG. 15(b), and shows a state after a frame-side coating step in the manufacturing method is complete.

FIG. 16 shows a cross-sectional view corresponding to FIG. 15(b) at the time when the frame-side coating step is complete.

Preferably, the frame-side coating step can be performed simultaneously with the busbar-side coating step by the same method as the coating method employed in the busbar-side coating step.

That is to say, when performing the busbar-side coating step by electrodeposition coating, the frame-side coating step can be performed by electrodeposition coating involving the same electrodeposition coating material, and when performing the busbar-side coating step by electrostatic powder coating, the frame-side coating step can be performed by electrostatic powder coating involving the same powder coating material.

According to this configuration, the production efficiency can be improved.

In the present embodiment, at least one of the busbar-side curing step and the frame-side curing step is configured so as to form semi-cured insulating resin layers 30, 65.

The semi-cured insulating resin layers 30, 65 can be obtained by suitably regulating the temperature during heat treatment.

The manufacturing method according to the present embodiment includes, after the busbar-side curing step and the frame-side curing step, an attachment step of curing a semi-cured insulating resin layer (such as the insulating resin layer 30), with the busbar assembly forming region 120 and the frame forming region 220 being placed one on top of the other, to thereby cause the circumferential part 230 and the busbar assembly forming region 120 to adhere to each other.

Figure 17:
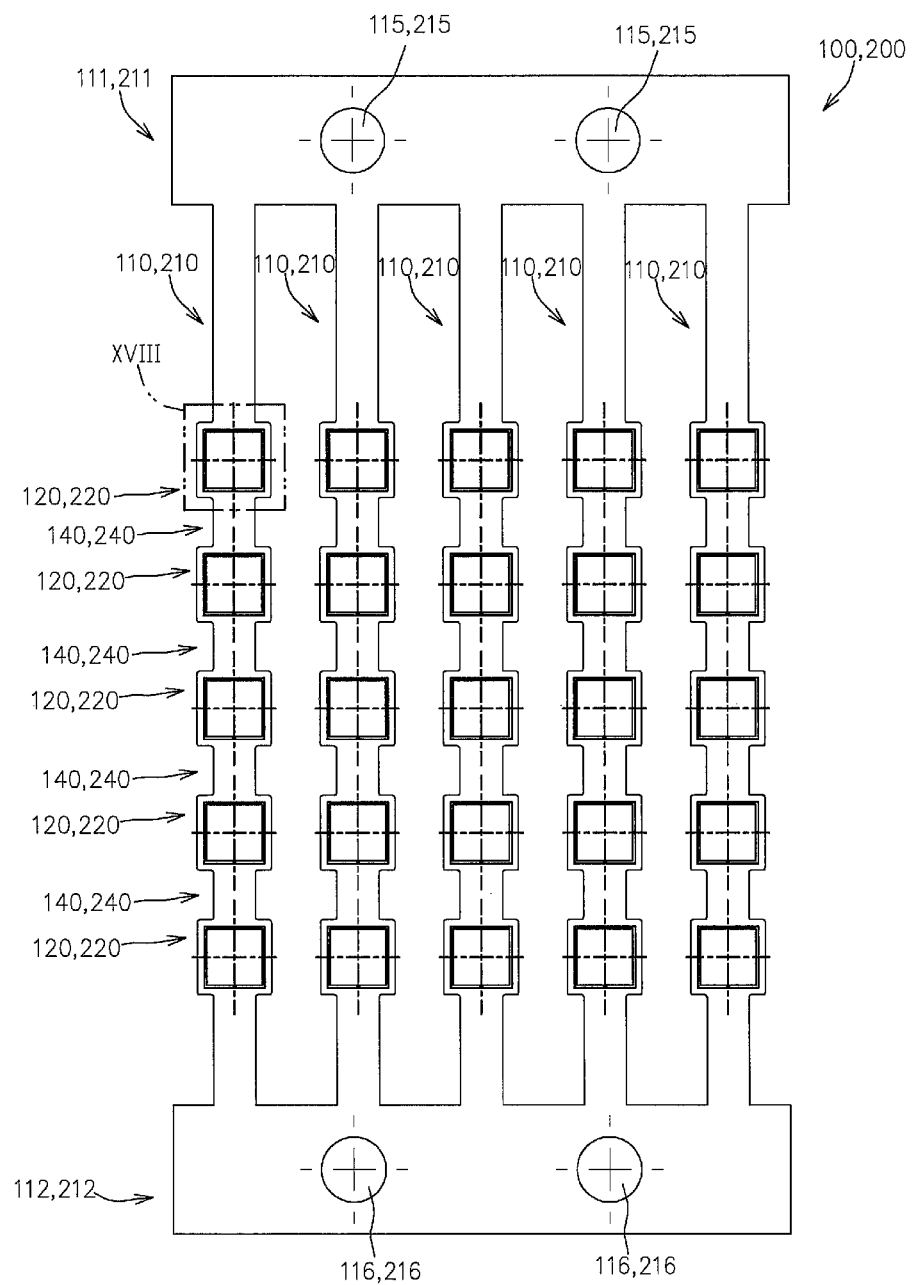
FIG. 17 is a plan view of the first and second conductive metal flat plates that are placed one on top of the other in an attachment step in the manufacturing method according to the second embodiment.

FIG. 17 shows a plan view of the first and second conductive metal flat plates 100, 200 at the time when the attachment step is complete.

Figure 18A:
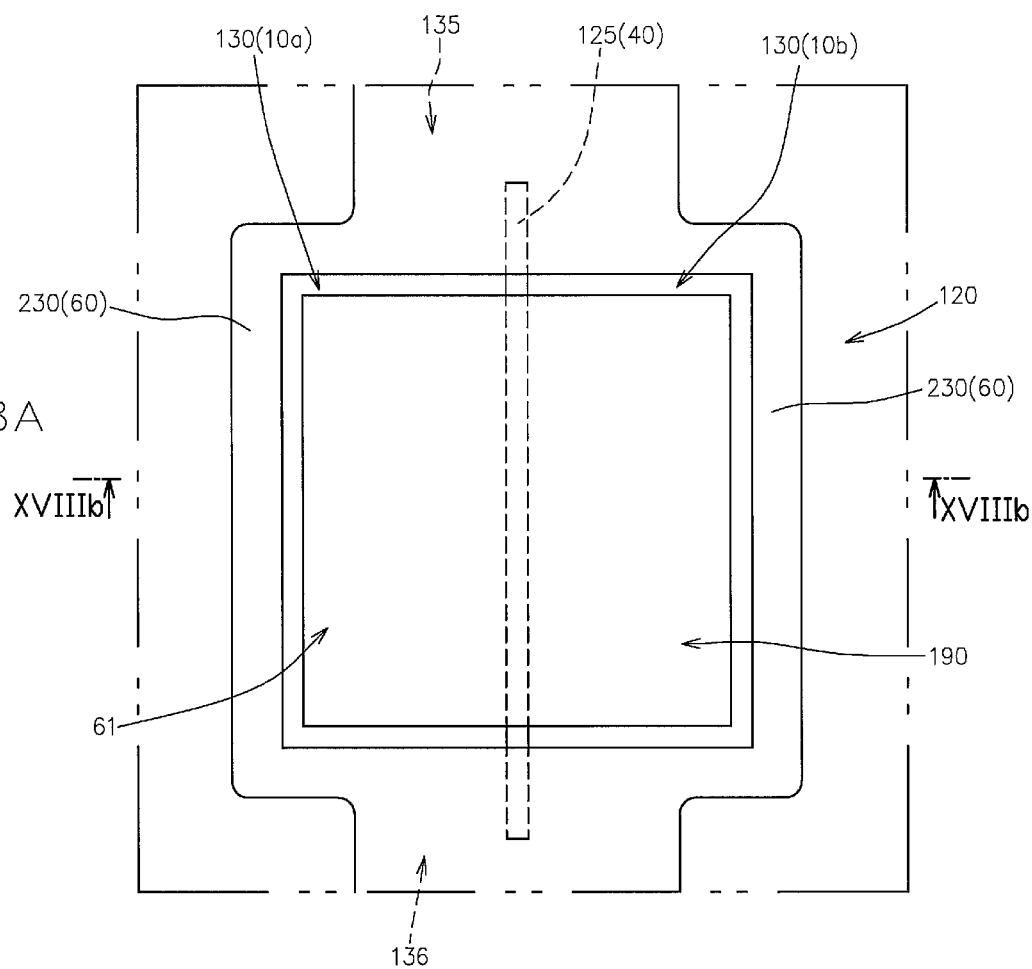
FIG. 18A is an enlarged view of the XVIII part in FIG. 17.
Figure 18B:
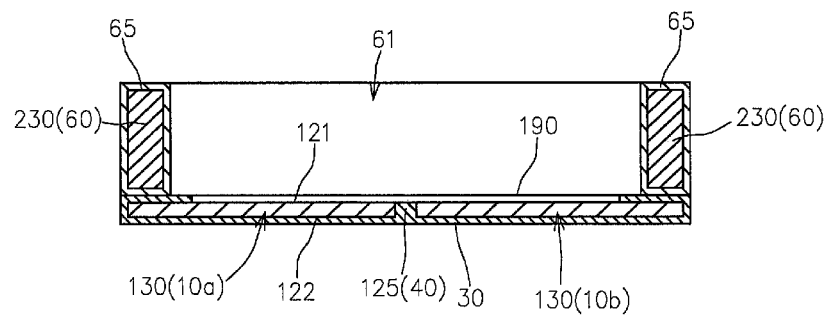
FIG. 18B is a cross-sectional view taken along the line XVIIIb-XVIIIb in FIG. 18A.

FIG. 18A shows an enlarged view of the XVIII part in FIG. 17, and FIG. 18B shows a cross-sectional view taken along the line XVIIIb-XVIIIb in FIG. 18A.

As shown in FIG. 2, the first conductive metal flat plate 100 includes busbar-side alignment holes 115, 116 in the busbar-side first and second connecting strips 111, 112, respectively, and, as shown in FIG. 14, the second conductive metal flat plate 200 includes frame-side alignment holes 215, 216 in the frame-side first and second connecting strips 211, 212, respectively.

As shown in FIG. 14, the first and second conductive metal flat plates 100, 200 are placed one on top of the other, with the busbar-side alignment holes 115 and the frame-side alignment holes 215 being aligned and the busbar-side alignment holes 116 and the frame-side alignment holes 216 being aligned, and thereby the busbar assembly forming region 120 and the frame forming region 220 are placed one on top of the other while being positionally matched.

The manufacturing method according to the present embodiment includes, after the attachment step, a cutting step of cutting off the joined busbar assembly forming region 120 and frame forming region 220 from the first and second conductive metal flat plates 100, 200 along the cutting line 126 set so as to cross the slit 125 in the width direction on one side in the longitudinal direction of the slit 125, and the cutting line 127 set so as to cross the slit 125 in the width direction on the other side in the longitudinal direction of the slit 125.

FIG. 19A shows an enlarged plan view of the busbar assembly forming region 120 and the frame forming region 220 wherein the cutting lines 126 and 127 are indicated by broken lines, and FIG. 19B shows a cross-sectional view taken along the line XIXb-XIXb in FIG. 19A.

The manufacturing method according to the present embodiment includes, after the attachment step and before the cutting step, a step of removing the mask 190 and forming the first and second plated layers 90a, 90b in a region, from which the mask 190 has been removed, of the pair of busbar forming parts 130.

FIGS. 19A and 19B show a state attained after the first and second plated layers 90a, 90b are formed.

DESCRIPTION OF THE REFERENCE NUMERALS 1A, 1B, 2A Busbar assembly
10a-10d Busbar
30 Insulating resin layer
65 Frame-side insulating resin layer
90a, 90b Plated layer
100 First conductive metal flat plate
110 Busbar assembly forming strip
111, 112 Connecting strip
120 Busbar assembly forming region
125 Slit
126, 127 Cutting line
130 Busbar forming part
135, 136 Connecting part
140 Connecting region
190 Mask
200 Second conductive metal flat plate
230 Circumferential part

The invention claimed is:

1. A method for manufacturing a busbar assembly wherein a plurality of busbars are electrically insulated and mechanically connected by an insulating resin layer, the method comprising:
   a step of providing a first conductive metal flat plate having a busbar assembly forming region;
   a slit forming step of forming a slit in the busbar assembly forming region, wherein the slit penetrates a first surface on one side in a thickness direction and a second surface on the other side in the thickness direction;
   a busbar-side coating step of coating the first conductive metal flat plate with a coating material containing an insulating resin such that at least the slit is filled with the insulating resin layer;
   a busbar-side curing step of curing the coating material applied in the busbar-side coating step to form the insulating resin layer; and
   a cutting step of cutting off the insulating resin layer in the slit and busbar forming parts of the first conductive metal flat plate from the first conductive metal flat plate, wherein the busbar forming parts face each other with the slit therebetween.

2. The method for manufacturing the busbar assembly according to claim 1, wherein the busbar-side coating step is performed by electrodeposition coating.

3. The method for manufacturing the busbar assembly according to claim 1, wherein the busbar-side coating step is performed by electrostatic powder coating.

4. The method for manufacturing the busbar assembly according to claim 1, comprising:
   a step of masking at least a part of the first surface of the busbar forming parts with a mask before the busbar-side coating step; and
   a step of removing the mask and forming a plated layer in a region, from which the mask has been removed, of the busbar forming parts before the cutting step.

5. The method for manufacturing the busbar assembly according to claim 1, wherein
   the first conductive metal flat plate after the slit forming step is configured such that the busbar forming parts facing each other with the slit therebetween are connected to each other via a connecting part of the first conductive metal flat plate located more toward one side in a longitudinal direction of the slit than the slit is and a connecting part of the first conductive metal flat plate located more toward the other side in the longitudinal direction of the slit than the slit is; and
   the cutting step comprises a process of cutting the first conductive metal flat plate in a thickness direction along a cutting line set so as to cross the slit in a width direction on one side in the longitudinal direction of the slit and a process of cutting the first conductive metal flat plate in the thickness direction along a cutting line set so as to cross the slit in the width direction on the other side in the longitudinal direction of the slit.

6. The method for manufacturing the busbar assembly according to claim 5, wherein
   the first conductive metal flat plate has a plurality of busbar assembly forming regions disposed in an X direction in an X-Y plane where the first conductive metal flat plate is located, and connecting regions for connecting the busbar assembly forming regions adjacent in the X direction; and
   the slit extends in the X direction.

7. The method for manufacturing the busbar assembly according to claim 6, wherein the first conductive metal flat plate has:
   a plurality of busbar assembly forming strips each including the plurality of busbar assembly forming regions arranged in the X direction and the connecting regions connecting the busbar assembly forming regions adjacent in the X direction, wherein the plurality of busbar assembly forming strips are disposed in parallel in the Y direction;
   a first connecting strip for connecting end parts on one side in the X direction of the plurality of busbar assembly forming strips to each other; and
   a second connecting strip for connecting end parts on the other side in the X direction of the plurality of busbar assembly forming strips to each other.

8. The method for manufacturing the busbar assembly according to claim 1, wherein an opening width of the slit narrows from one of the first surface and the second surface toward the other.

9. The method for manufacturing the busbar assembly according to claim 1, comprising before the cutting step:
   a step of providing a second conductive metal flat plate different from the first conductive metal flat plate, wherein the second conductive metal flat plate has a frame forming region corresponding to the busbar assembly forming region;
   a step of punching out an inner part surrounded by a circumferential part of the frame forming region so as to retain the circumferential part;
   a frame-side coating step of applying a coating material containing an insulating resin to an outer circumferential surface of the circumferential part of the frame forming region;
   a frame-side curing step of curing the coating material applied in the frame-side coating step to form a frame-side insulating resin layer, wherein at least one of the frame-side curing step and the busbar-side curing step is configured so as to form a semi-cured insulating resin layer; and
   an attachment step of curing the semi-cured insulating resin layer, with the busbar assembly forming region and the frame forming region being placed one on top of the other, to thereby cause the circumferential part and the busbar assembly forming region to adhere to each other,
   wherein the cutting step comprises a process of cutting off the circumferential part from the second conductive metal flat plate in addition to the process of cutting off the insulating resin layer in the slit and the busbar forming parts from the first conductive metal flat plate wherein the busbar forming parts face each other with the slit therebetween.

* * * * *